United States Patent
Wu et al.

(10) Patent No.: US 10,090,207 B2
(45) Date of Patent: Oct. 2, 2018

(54) MULTI-POINT CHEMICAL MECHANICAL POLISHING END POINT DETECTION SYSTEM AND METHOD OF USING

(71) Applicant: TAIWAN SEMICONDUCTOR MANUFACTURING COMPANY, LTD., Hsinchu (TW)

(72) Inventors: Jiann Lih Wu, Hsinchu (TW); Jeng-Jyi Hwang, Chu-Tong Town (TW); Soon-Kang Huang, Hsinchu (TW); Chi-Ming Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1385 days.

(21) Appl. No.: 13/687,492

(22) Filed: Nov. 28, 2012

(65) Prior Publication Data

US 2014/0148008 A1 May 29, 2014

(51) Int. Cl.
*B24B 49/12* (2006.01)
*H01L 21/66* (2006.01)
*B24B 37/013* (2012.01)
*B24B 37/04* (2012.01)

(52) U.S. Cl.
CPC ............ *H01L 22/12* (2013.01); *B24B 37/013* (2013.01); *B24B 37/04* (2013.01); *B24B 49/12* (2013.01); *H01L 22/26* (2013.01); *H01L 2924/0002* (2013.01)

(58) Field of Classification Search
CPC ................ B24B 49/12; B24B 49/10
USPC ........... 451/6, 5, 41, 288, 289, 290, 8, 9, 10
See application file for complete search history.

(56) References Cited

U.S. PATENT DOCUMENTS

| | | | |
|---|---|---|---|
| 5,838,447 A * | 11/1998 | Hiyama et al. | 356/600 |
| 6,074,287 A * | 6/2000 | Miyaji | B24B 49/12 451/287 |
| 6,247,998 B1 * | 6/2001 | Wiswesser et al. | 451/6 |
| 6,679,756 B2 * | 1/2004 | Ishikawa et al. | 451/6 |
| 6,878,038 B2 * | 4/2005 | Johansson et al. | 451/6 |
| 7,001,242 B2 * | 2/2006 | Birang et al. | 451/5 |
| 8,246,417 B2 * | 8/2012 | Kobayashi et al. | 451/5 |
| 2002/0173244 A1 * | 11/2002 | Sekiya | B24B 7/228 451/41 |
| 2003/0181139 A1 * | 9/2003 | Lehman et al. | 451/8 |
| 2005/0245171 A1 * | 11/2005 | Hosaka et al. | 451/6 |
| 2009/0305610 A1 * | 12/2009 | Yilmaz et al. | 451/6 |

* cited by examiner

*Primary Examiner* — Robert Rose
(74) *Attorney, Agent, or Firm* — Hauptman Ham, LLP (57) ABSTRACT

A wafer polishing system including a platen configured to rotate in a first direction, and a polishing head configured to hold a wafer, the polishing head configured to rotate in a second direction. The wafer polishing system further includes an optical sensing system configured to detect a thickness of the wafer at a first location on the platen and a second location on the platen. A first distance from a center of the platen to the first location is different than a second distance from the center of the platen to the second location.

17 Claims, 8 Drawing Sheets

MULTI-POINT CHEMICAL MECHANICAL POLISHING END POINT DETECTION SYSTEM AND METHOD OF USING

BACKGROUND

Integrated circuits are formed using various processing steps. Some processing steps involve depositing dielectric layers or metal layers on a semiconductor wafer. The deposition processes result in non-planar surfaces, in some instances. The non-planar surfaces are polished to provide a more uniform surface for additional processing. In some instances, the polishing is performed by chemical mechanical polishing (CMP) which removes material from the non-planar surfaces to provide the more uniform surface and reduce a thickness of the semiconductor wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
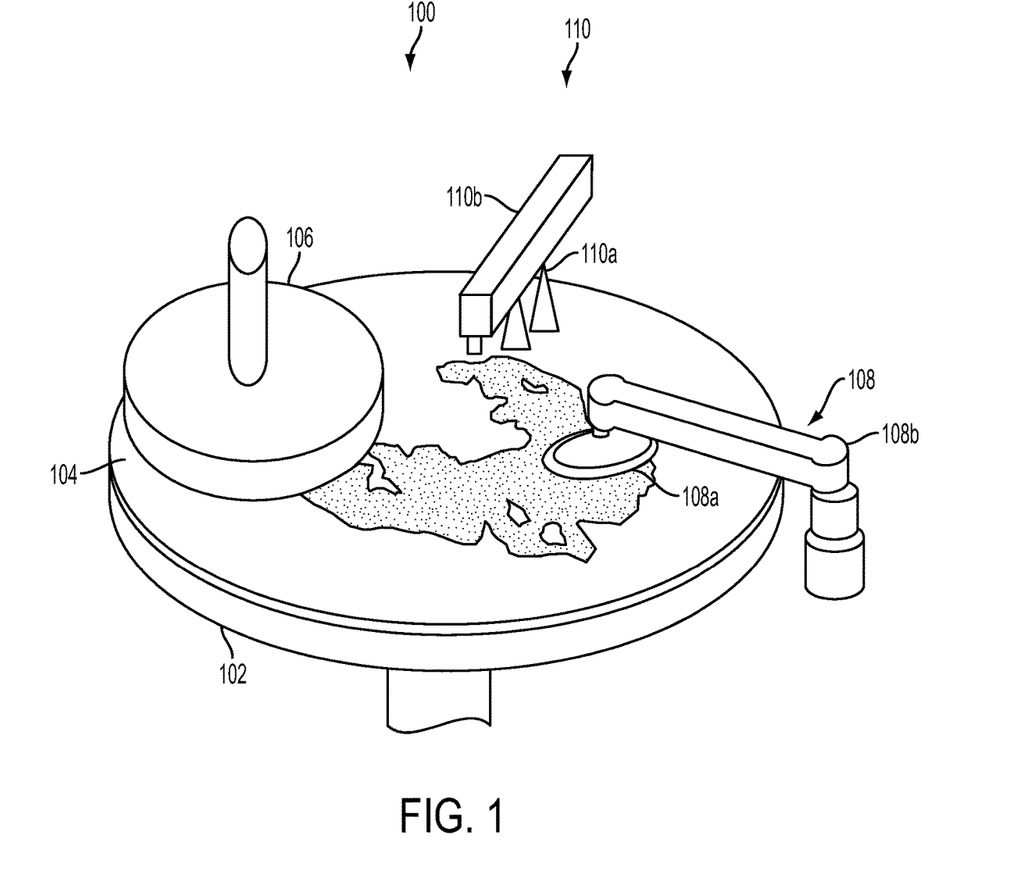
FIG. 1 is a diagram of a chemical mechanical polishing (CMP) system in accordance with one or more embodiments.

A chemical mechanical polishing (CMP) system uses a combination of chemical reactions and mechanical grinding to remove material from a surface of a semiconductor device. FIG. 1 is a diagram of a CMP system 100 in accordance with one or more embodiments. CMP system 100 includes a platen 102 configured to rotate in at least one direction. A polishing pad 104 is provided on top of platen 102. A polishing head 106 is configured to support a wafer for processing using CMP system 100. Polishing head 106 is configured to adjust a pressure exerted on the wafer by polishing pad 104. CMP system 100 further includes a conditioner 108 configured to restore a surface texture of polishing pad 104. CMP system 100 further includes a slurry delivery system 110 configured to deliver a slurry to polishing pad 104 to facilitate removal of material from the wafer.

CMP system 100 removes material from the wafer based on relative motion between polishing pad 104 and polishing head 106. A slurry introduced to polishing pad 104 by slurry delivery system 110 reacts with materials on the wafer and mechanical force exerted on the wafer by the polishing pad removes material from the wafer.

Platen 102 is configured to rotate in at least a first direction. In some embodiments, platen 102 is configured to rotate in more than one direction. In some embodiments, platen 102 is configured to be held stationary. In some embodiments, platen 102 is configured to have a constant rotational speed. In some embodiments, platen 102 is configured to have a variable rotational speed. In some embodiments, platen 102 is rotated by a motor. In some embodiments, the motor is an alternating current (AC) motor, a direct current (DC) motor, a universal motor, or another suitable motor. In some embodiments, platen 102 is configured to translate in one or more directions.

Platen 102 is configured to support polishing pad 104. Polishing pad 104 is configured to connect to platen 102 so that polishing pad 104 rotates in a same direction at a same speed as the platen. In some embodiments where platen 102 is stationary, polishing pad 104 is held stationary. Polishing pad 104 has a textured surface which is configured to remove material from the wafer during operation of CMP system 100.

Polishing head 106 is configured to support the wafer during operation of CMP system 100. In some embodiments, polishing head 106 includes a retaining ring to secure the wafer against the polishing head. In some embodiments, polishing head 106 includes a vacuum to secure the wafer against the polishing head. Polishing head 106 is configured to rotate in a second direction. In some embodiments, the second direction is the same as the first direction. In some embodiments, the second direction is opposite the first direction. In some embodiments, polishing head 106 is configured to rotate at a constant rotational speed. In some embodiments, polishing head 106 is configured to rotate at a variable rotational speed. In some embodiments, polishing head 106 is rotated by a motor. In some embodiments, the motor is an AC motor, a DC motor, a universal motor, or another suitable motor. In some embodiments, polishing head 106 is held stationary. In some embodiments, polishing head 106 translates relative to polishing pad 104.

Polishing head 106 is configured to move in a direction perpendicular to the surface of polishing pad 104. By moving polishing head 106 in the direction perpendicular to the surface of polishing pad 104, the pressure exerted on the wafer by the polishing pad is adjustable. In some embodiments, polishing head 106 includes pressure sensors to monitor a pressure exerted on the wafer. In some embodiments, the pressure sensors are connected to a control system. In some embodiments, polishing head 106 includes pressure adjustment means configured to exert force on a surface of wafer opposite polishing pad 104 to adjust the pressure exerted on the wafer at various locations of the wafer. In some embodiments, the pressure adjustment means include nozzles configured to emit pressurized gas, translatable pins or other suitable force exerting elements.

Conditioner 108 is configured to restore the texture of polishing pad 104. During operation of CMP system 100, polishing pad 104 becomes smooth as a result of the force between the wafer and the polishing pad. Conditioner 108 is configured to restore the texture of polishing pad 104 to maintain effective operation of CMP system 100.

Conditioner 108 includes a conditioner pad 108a configured to contact polishing pad 104. In some embodiments, conditioner pad 108a is configured to rotate. Conditioner 108 also includes a conditioner arm 108b configured to translate conditioner pad 108a across the surface of polishing pad 104.

Slurry delivery system 110 is configured to provide the slurry onto polishing pad 104. In some embodiments, slurry deliver system 110 includes a slurry mixing system configured to mix various fluid compositions prior to delivering the mixture to polishing pad 104. Slurry delivery system 110 includes at least one nozzle 110a configured to deliver the slurry to polishing pad 104. Slurry delivery system 110 further includes a delivery arm 110b configured to translate a location of nozzle 110a relative to the surface of polishing pad 104.

Figure 2:
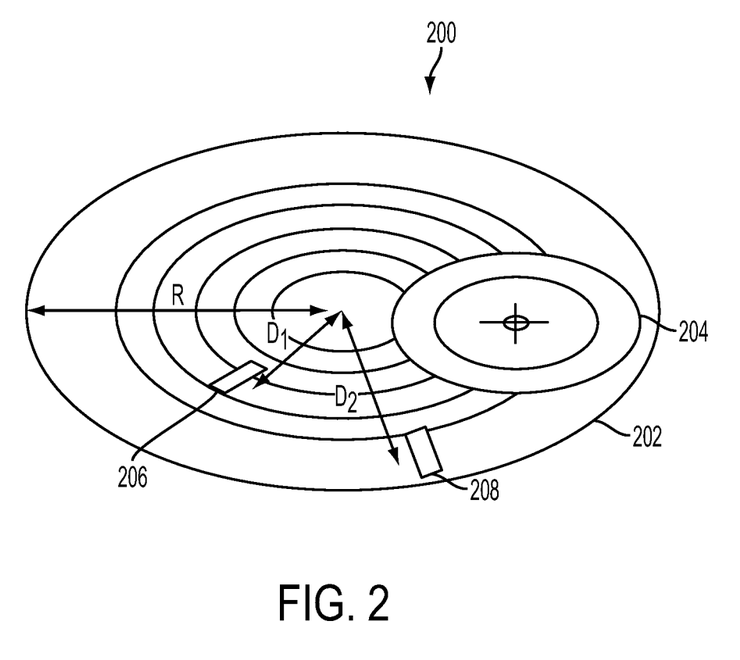
FIG. 2 is a diagram of a platen and a wafer having multiple detection points in accordance with one or more embodiments.

During operation of CMP system 100, a thickness of the wafer is monitored to determine an end point for the polishing process. During operation of CMP system 100, a surface profile of the wafer is also monitored to determine uniformity of the CMP process. FIG. 2 is a diagram of a platen 202 and a wafer 204 having multiple detection points 206 and 208 in accordance with one or more embodiments. A first detection point 206 is located a first distance D1 from a center of platen 202. A second detection point 208 is located a second distance D2 from the center of platen 202. First distance D1 is different than second distance D2. Platen 202 supports a polishing pad which is not shown in FIG. 2 for simplicity. Wafer 204 is supported by a polishing head which is not shown in FIG. 2 for simplicity. Other components are also omitted from FIG. 2 for simplicity.

Platen 202 has a radius R extending from the center of the platen to an exterior edge of the platen. In some embodiments, radius R of platen 202 is at least 2.5 times greater than a radius of wafer 204. If the radius R of platen 202 is less than the 2.5 times greater than the radius of wafer 204, maintaining a texture of the polishing pad will be difficult, which increases polishing time and decreases production yield, in some embodiments. First distance D1 is the distance from the center of platen 202 to a center of first detection point 206. Second distance D2 is the distance from the center of platen 202 to a center of second detection point 208. In some embodiments, first distance D1 ranges from 0.4R to 0.6R. If first distance D1 exceeds this range at either end point, a central portion of wafer 204 will have insufficient monitoring to accurately determine the thickness and profile of the wafer, in some embodiments. In some embodiments, second distance D2 ranges from 0.8R to R. If second distance D2 is less than 0.8R, a peripheral portion of wafer 204 will have insufficient monitoring to accurately determine the thickness and profile of the wafer, in some embodiments. If second distance D2 exceeds R, wafer 204 is not monitored, in some embodiments.

Figures 3A, 3C:
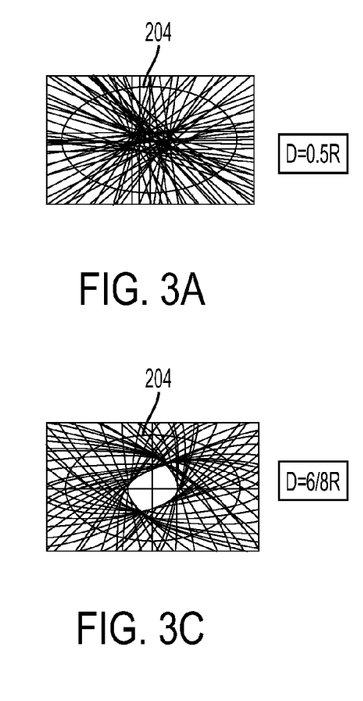
FIGS. 3A-3E are diagrams of path traces of a single detection point along the wafer during a CMP process in accordance with one or more embodiments.
Figures 3B, 3D:
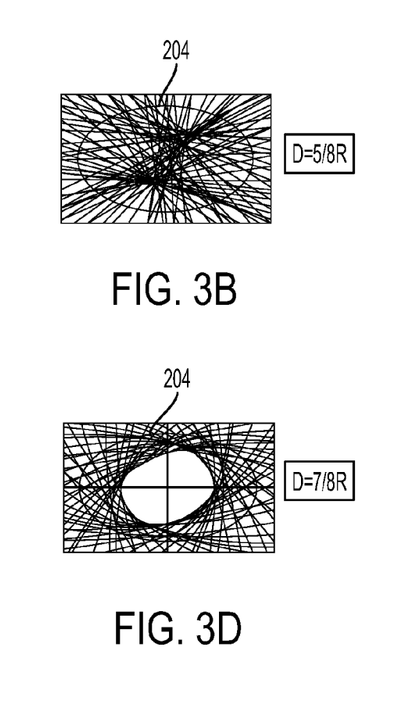
Figure 3E:
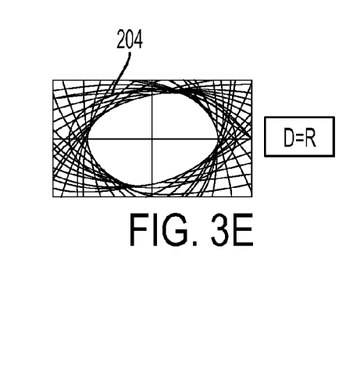

As platen 202 and wafer 204 rotate, a location of first and second detection points 206 and 208 relative to wafer 204 changes. FIGS. 3A-3E show a path trace of a detection point with respect to a wafer 204 for various distances from the center of platen 202. As shown in FIGS. 3A-3E, a single detection point collects a disproportionate amount of data relating to isolated areas of wafer 204, while collecting little, if any, data related to other areas of the wafer. For example, a detection point located at a position equal to half the radius R of platen 202 collects a majority of data at a central location of wafer 204, but a smaller amount of data near the periphery of the wafer, as seen in FIG. 3A. In another example, a detection point located at a position equal to the radius R of platen 202 collects data at a peripheral location of wafer 204 but no data at the central location of the wafer, as seen in FIG. 3E. By using multiple distinct detection points, a more uniform amount of data is collected related to various areas across wafer 204. The uniform amount of data enables a more accurate determination of the thickness and profile of wafer 204.

Figure 4A:
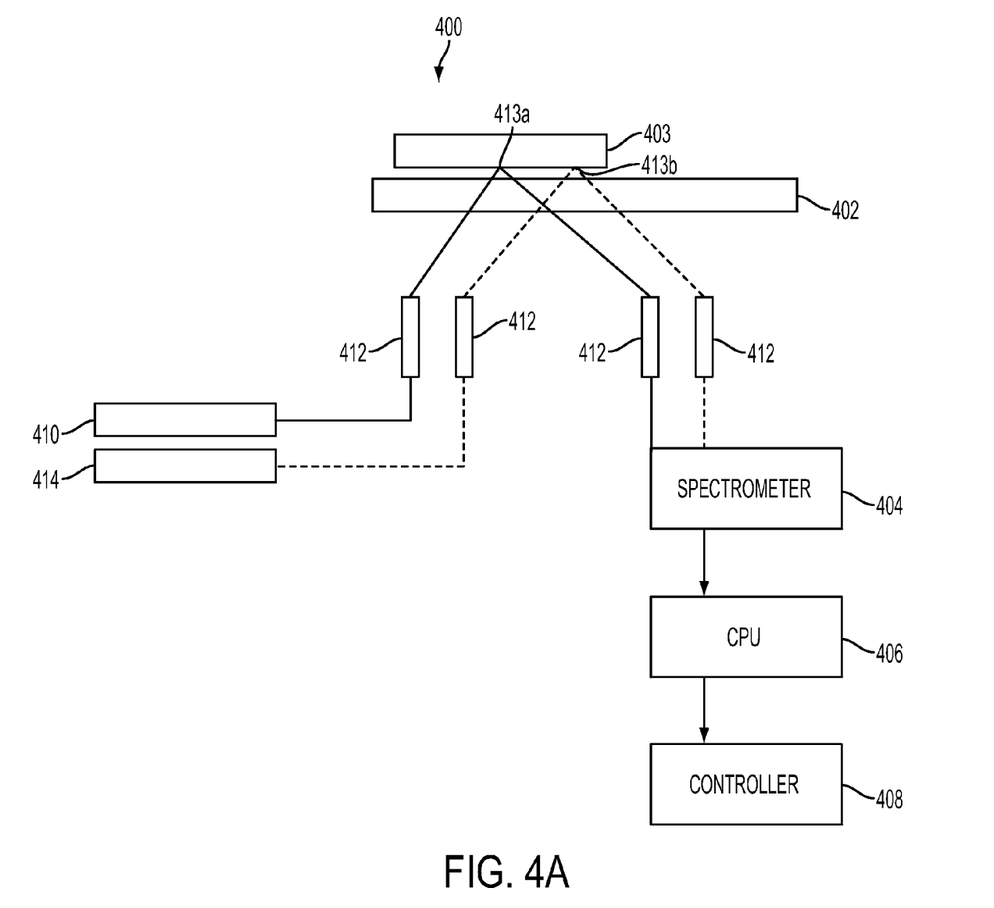
FIG. 4A is a diagram of a multi-point CMP end detection system in accordance with one or more embodiments.

FIG. 4A is a diagram of a multi-point CMP end detection system 400 in accordance with one or more embodiments. In the embodiment of FIG. 4A, multi-point CMP end detection system 400 is an optical sensing system. Multi-point CMP end detection system 400 includes a platen 402 which is configured to receive at least two light beams. A wafer 403 being polished using platen 402. A surface of wafer 403 being polished reflects the at least two light beams propagating through platen 402. Light reflected from the surface of wafer 403 is received by a spectrometer 404 configured to analyze the reflected light. A computer processing unit (CPU) 406 is configured to receive a signal from spectrometer 404 and process the signal. A controller 408 is configured to receive the processed signal from CPU 406 and generated instructions for adjusting a pressure exerted on wafer 403 by moving a polishing head, e.g., polishing head 106 (FIG. 1). A first light source 410 is configured to emit a first light beam incident on platen 402. Optical fibers 412 are configured to guide the first light beam to a first location 413a on wafer 403 and to guide the first light beam reflected from the wafer to spectrometer 404. A second light source 414 is configured to emit a second light beam to be incident on wafer 403 at a second location 413b. Second location 413b on wafer 403 is different than first location 413a. Optical fibers 412 are also configured to guide the reflected second light beam to spectrometer 404.

Platen 402 is similar to platen 102 of FIG. 1. Platen 402 is transparent to facilitate propagation of the first and second light beams. Wafer 403 is similar to wafer 204 of FIG. 2. The surface of wafer 403 being polished reflects the first and second light beams back through platen 402. A direction and intensity of light reflected by wafer 403 is determined based on a profile of the surface of wafer 403 as well distance between a top surface of platen 402 and the surface of the wafer. The reflection based on the distance from the top surface of platen 402 and the surface of wafer 403 allows calculation of the thickness of the wafer at the first and second locations 413a and 413b. The profile of the surface of wafer 403 allows monitoring of uniformity of a CMP process. Non-uniformity of the CMP process is the result of texture patterns in a polishing pad, e.g., polishing pad 104 (FIG. 1), a pressure exerted on wafer 403 during the CMP process, or curvature of the wafer, in some instances. The reflected first and second light beams provide information regarding both the profile and the thickness of wafer 403.

Spectrometer 404 is configured to receive light reflected from wafer 403 and convert the reflected light into an electrical signal. The electrical signal is indicative of the thickness and surface profile for wafer 403. In some embodiments, spectrometer 404 is configured to receive the reflected light at separate sensor locations. In some embodiments, spectrometer 404 is configured to receive the reflected light at a single sensor location and the first and second light beams are pulsed so that only one light beam is received at a time. In some embodiments, spectrometer 404 is configured to receive reflected light having more than one wavelength.

CPU 406 is configured to receive the electrical signal generating by spectrometer 404. CPU 406 analyzes the electrical signal to determine the thickness and profile of wafer 403. CPU 406 is configured to provide a pressure adjustment signal to controller 408 based on the determined thickness and profile.

Controller 408 is configured to generate instructions for adjusting a pressure exerted on wafer 403 by a polishing head, e.g., polishing head 106 (FIG. 1), based on the pressure adjustment signal. In some embodiments, CPU 406 and controller 408 are integrated into a single element capable of performing the functions of both elements. In some embodiments, controller 408 is configured to provide the instructions to the polishing head by a wired electrical connection. In some embodiments, controller 408 is configured to provide the instructions to the polishing head by a wireless network connection.

In some embodiments, the endpoint sensing system is an eddy current sensing system. In some embodiments, the eddy current sensing system includes a first coil under polishing pad 104 configured to generate a magnetic force; a conductive material on the wafer generates an eddy current in response to the magnetic force. The eddy current in turn creates a new magnetic field proportion to a thickness of the conductive material detected by a second coil under polishing pad 104.

In some embodiments, an endpoint sensing system is an optical sensing system. In at least one embodiment where the endpoint sensing system is an optical sensing system, the optical sensing system includes a first light source 410 is configured to emit the first light beam. In some embodiments, first light source 410 is a broad waveband light source. In some embodiments, first light source 410 is a laser light source having a narrow wavelength range. In some embodiments, first light source 410 is configured to have a tunable wavelength. In some embodiments, a wavelength of first light source 410 ranges from the visible spectrum, 380 nanometers (nm) to 780 nm, to the infrared spectrum, 780 nm to 14,000 nm. In some embodiments, first light source 410 is a pulsed light source having a first pulse frequency.

Optical fibers 412 are configured to convey light from an input end to an output end. In some embodiments, optical fibers 412 are multi-mode optical fibers. In some embodiments, optical fibers 412 are single mode optical fibers. In some embodiments, optical fibers 412 include a light directing end face configured to direct an emitted light beam to first or second location 413a or 413b. In some embodiments, multi-point CMP end detection system 400 includes additional optical elements configured to direct light to the predefined location. The additional optical elements include lenses, mirrors, prisms, or other suitable optical elements.

Second light source 414 is configured to emit the second light beam. In some embodiments, second light source 414 is a broad waveband light source. In some embodiments, second light source 414 is a laser light source having a narrow wavelength range. In some embodiments, second light source 414 is configured to have a tunable wavelength. In some embodiments, a wavelength of second light source 414 ranges from the visible spectrum to the infrared spectrum. In some embodiments, second light source 414 is a pulsed light source having a second pulse frequency. In some embodiments, second light source 414 has a different wavelength than first light source 410. In some embodiments, second light source 414 has a same wavelength as first light source 410. In some embodiments, the second pulse frequency is different than the first pulse frequency. In some embodiments, the second pulse frequency is the same as the first pulse frequency. In some embodiments, first light source 410 and second light source 414 are configured such that only one light source emits light at one time.

In some embodiments, multi-point CMP end detection system 400 has more than two light sources and more than two points of detection. As the number of points of detection increases the accuracy of the thickness and profile determination of the wafer increases; however, the complexity of multi-point CMP end detection system 400 also increases. As a size of wafer 403 increases, a greater number of detection points is advantageous to accurately determine thick thickness and profile of the wafer.

Figure 4B:
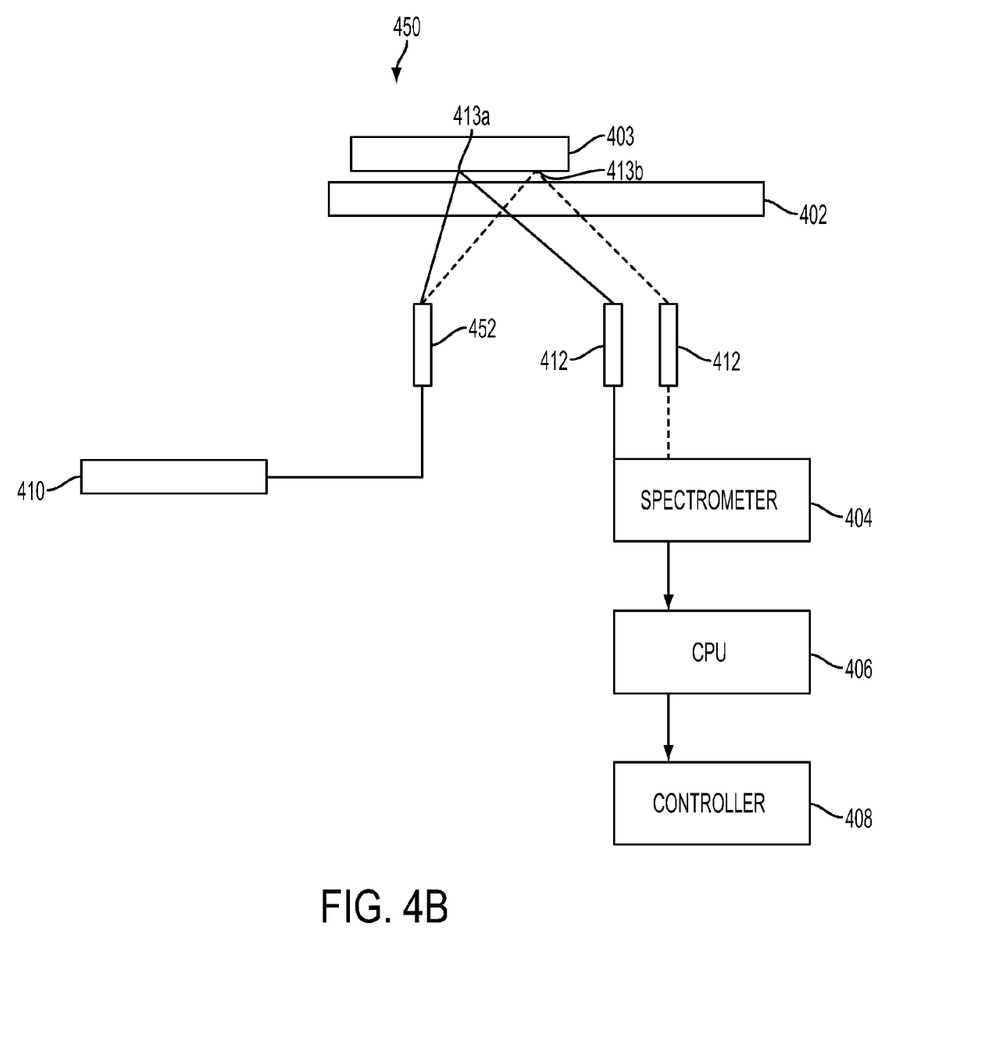
FIG. 4B is a diagram of a multi-point CMP end detection system in accordance with one or more embodiments.

FIG. 4B is a diagram of a multi-point CMP end detection system 450 in accordance with one or more embodiments. Multi-point CMP end detection system 450 is similar to multi-point end detection system 400 (FIG. 4A) except that multi-point CMP end detection system 450 includes only first light source 410 and a beam splitting element 452 configured to receive light from first light source 410. Beam splitting element 452 is configured separate an incident light beam into at least two separate light beams. A first of the separated light beams is directed to first location 413a and a second of the separate light beams is directed to second location 413b. In some embodiments, beam splitting element 452 is integrated into an end face of an optical fiber. In some embodiments, beam splitting element 452 comprises a polarizing beam splitter. In some embodiments, beam splitting element 452 comprises at least one mirror, prism or other suitable beam splitting element.

Figure 5:
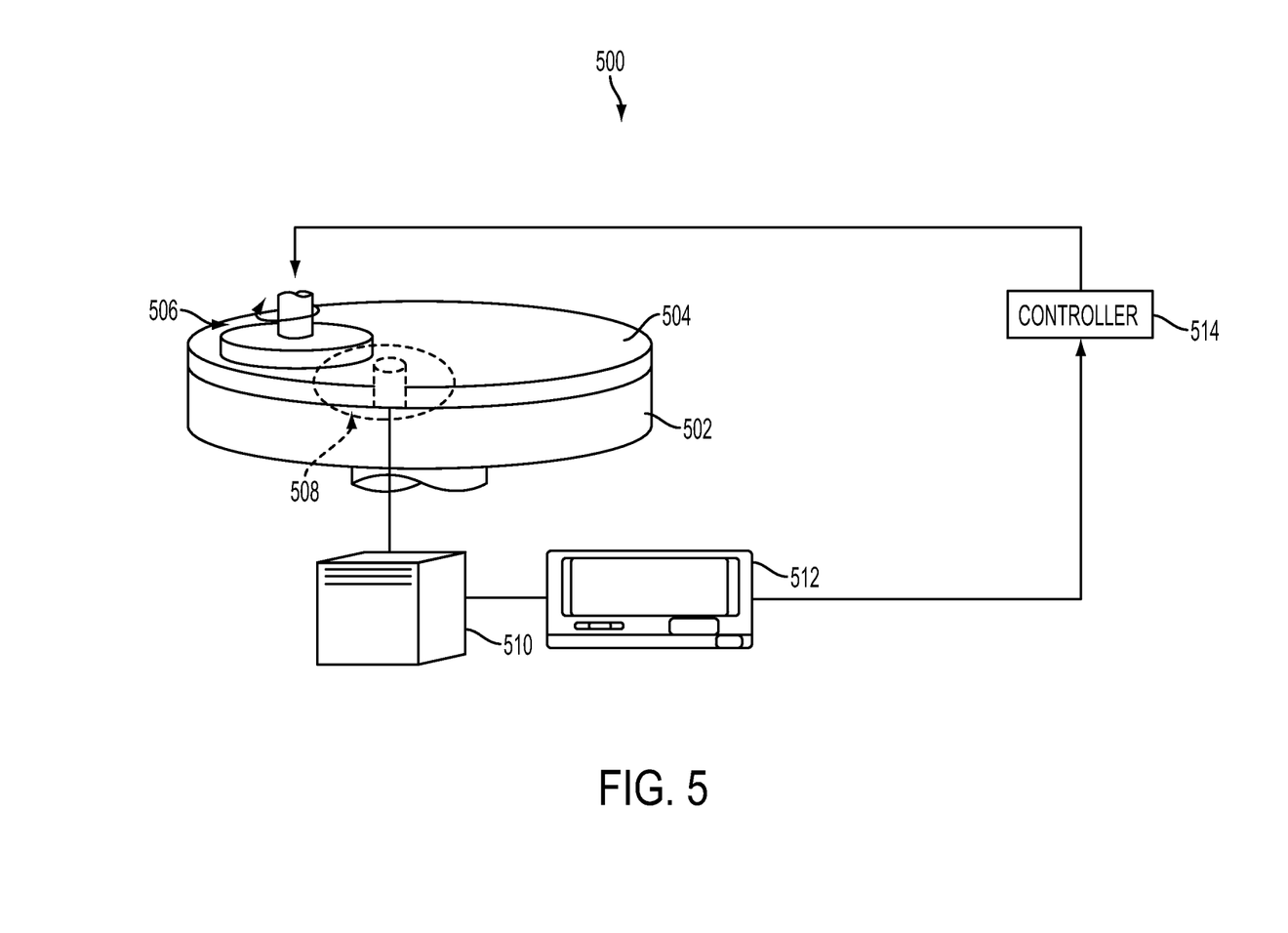
FIG. 5 is a diagram of a control feedback loop for controlling a polishing head of a CMP system in accordance with one or more embodiments.

FIG. 5 is a diagram of a control feedback loop for controlling a polishing head 506 of a CMP system 500 in accordance with one or more embodiments. CMP system 500 includes a platen 502 similar to platen 102 (FIG. 1). CMP system 500 further includes polishing pad 504 similar to polishing pad 104 (FIG. 1). Polishing head 506 is configured to support a wafer subjected to a CMP process using CMP system 500. A sensor location 508 is used to measure a thickness and a surface profile of the wafer during the CMP process. FIG. 5 shows a single sensor location 508 for simplicity. A spectrometer 510 is configured to receive light from sensor location 508 and convert the received light to an electrical signal. A CPU 512 is configured to receive the electrical signal from spectrometer 510. CPU 512 is configured to analyze the electrical signal and determine the thickness and surface profile of the wafer. A controller 514 is configured to connect to CPU 512 and generate instructions for adjusting a pressure exerted on the wafer by polishing head 506 based on the thickness and surface profile of the wafer.

Polishing head 506 is similar to polishing head 106 (FIG. 1). Sensor location 508 is similar to first and second locations 413a and 413b (FIGS. 4A and 4B). Spectrometer 510 is similar to spectrometer 404 (FIGS. 4A and 4B). CPU 512 is similar to CPU 406 (FIGS. 4A and 4B). Controller 514 is similar to controller 408 (FIGS. 4A and 4B). In some embodiments, CPU 512 and controller 514 are integrated into a single element configured to perform the function of both elements.

Polishing head 506 is configured have a position adjustable in a direction perpendicular to a polishing surface of polishing pad 504 in response to instructions received from controller 514. By adjusting the position of polishing head 506, the pressure exerted on the wafer is adjusted. Adjusting the pressure on the wafer, tunes the CMP process to provide a more uniform profile on the polished surface of the wafer.

CPU 512 is also configured to determine when the thickness of the wafer reaches a target thickness indicating that sufficient material is removed from the wafer. Based on the information received using sensor location 508 and spectrometer 510, CPU 512 determines the thickness of the wafer. Once the thickness of the wafer reaches the target thickness, CPU 512, via controller 514, provides instructions for polishing head 506 to remove the wafer from polishing pad 504.

Figure 6:
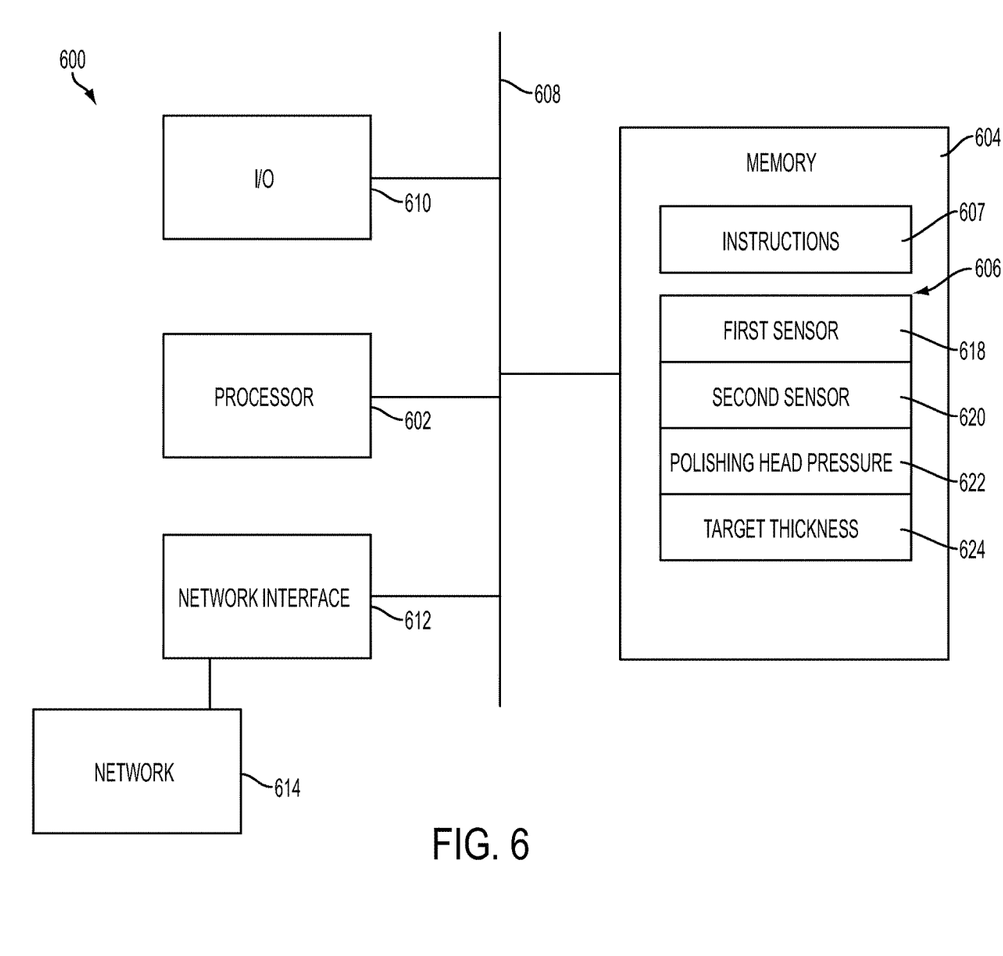
FIG. 6 is a block diagram of a general purpose computing device for implementing the feedback loop in FIG. 5 in accordance with one or more embodiments.

FIG. 6 is a block diagram of a general purpose computing device 600 for implementing the feedback loop in FIG. 5 in accordance with one or more embodiments. Computing device 600 includes a hardware processor 602 and a non-transitory, computer readable storage medium 604 encoded with, i.e., storing, the computer program code 606, i.e., a set of executable instructions. Computer readable storage medium 604 is also encoded with instructions 607 for interfacing with elements of CMP system 500. The processor 602 is electrically coupled to the computer readable storage medium 604 via a bus 608. The processor 602 is also electrically coupled to an I/O interface 610 by bus 608. A network interface 612 is also electrically connected to the processor 602 via bus 608. Network interface 612 is connected to a network 614, so that processor 602 and computer readable storage medium 604 are capable of connecting to external elements via network 614. The processor 602 is configured to execute the computer program code 606 encoded in the computer readable storage medium 604 in order to cause computing device 600 to be usable for performing a portion or all of the operations as described with respect to multi-point CMP end detection system 400, 450 or CMP system 500.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is an electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 604 includes a compact disk-read only memory (CD-ROM), a compact disk-read/write (CD-R/W), and/or a digital video disc (DVD).

In some embodiments, the storage medium 604 stores the computer program code 606 configured to cause computing device 600 to perform the operations as described with respect to multi-point CMP end detection system 400, 450 or CMP system 500. In some embodiments, the storage medium 604 also stores information needed for performing the operations as described with respect to multi-point CMP end detection system 400, 450 or CMP system 500, such as a first sensor parameter 618, a second sensor parameter 620, a polishing head pressure parameter 622, a target thickness parameter 624 and/or a set of executable instructions to perform the operation as described with respect to multi-point CMP end detection system 400, 450 or CMP system 500.

In some embodiments, the storage medium 604 stores instructions 607 for interfacing with CMP system 500. The instructions 607 enable processor 602 to generate operating instructions readable by elements of the CMP system to effectively implement the operations as described with respect to multi-point CMP end detection system 400, 450 or CMP system 500.

Computer device 600 includes I/O interface 610. I/O interface 610 is coupled to external circuitry. In some embodiments, I/O interface 610 includes a keyboard, keypad, mouse, trackball, trackpad, and/or cursor direction keys for communicating information and commands to processor 602.

Computing device 600 also includes network interface 612 coupled to the processor 602. Network interface 612 allows computing device 600 to communicate with network 614, to which one or more other computer systems are connected. Network interface 612 includes wireless network interfaces such as BLUETOOTH, WIFI, WIMAX, GPRS, or WCDMA; or wired network interface such as ETHERNET, USB, or IEEE-1394. In some embodiments, the operations as described with respect to multi-point CMP end detection system 400, 450 or CMP system 500 are implemented in two or more computing devices 600, and information such as first sensor information, second sensor information, polishing head pressure and target thickness are exchanged between different computing devices 600 via network 614.

Computing device 600 is configured to receive information related to the first sensor location through I/O interface 610. The information is transferred to processor 602 via bus 608 to determine the thickness and profile of the wafer at the first sensor location. The thickness and profile are then stored in computer readable medium 604 as first sensor parameter 618. Computing device 600 is configured to receive information related to the second sensor location through I/O interface 610. The information is transferred to processor 602 via bus 608 to determine the thickness and profile of the wafer at the second sensor location. The thickness and profile are then stored in computer readable medium 604 as second sensor parameter 620. Computing device 600 is configured to receive information related to polishing head pressure through I/O interface 610. In some embodiments, the pressure information is provided by pressure sensors located in the polishing head. The information is stored in computer readable medium 604 as polishing head pressure parameter 622. Computing device 600 is configured to receive information related to target thickness through I/O interface 610. In some embodiments, the target thickness information is received from an operator. In some embodiments, the target thickness is calculated based on information received by computing device 600 related to a deposition process. The information is stored in computer readable medium 604 as target thickness parameter 624.

During operation, processor 602 executes a set of instructions to determine whether to adjust the pressure of the polishing head based on first sensor parameter 618, second sensor parameter 620 and polishing head pressure parameter 622. During operation, processor 602 executes a set of instructions to determine whether the CMP process is complete based on first sensor parameter 618, second sensor parameter 620 and target thickness parameter 624. Based on the above determinations, processor 602 generates the pressure adjustment signal to adjust the position of the polishing head. In some embodiments, the pressure adjustment signal is transmitted using I/O interface 610. In some embodiments, the pressure adjustment signal is transmitted using network interface 612.

Figure 7:
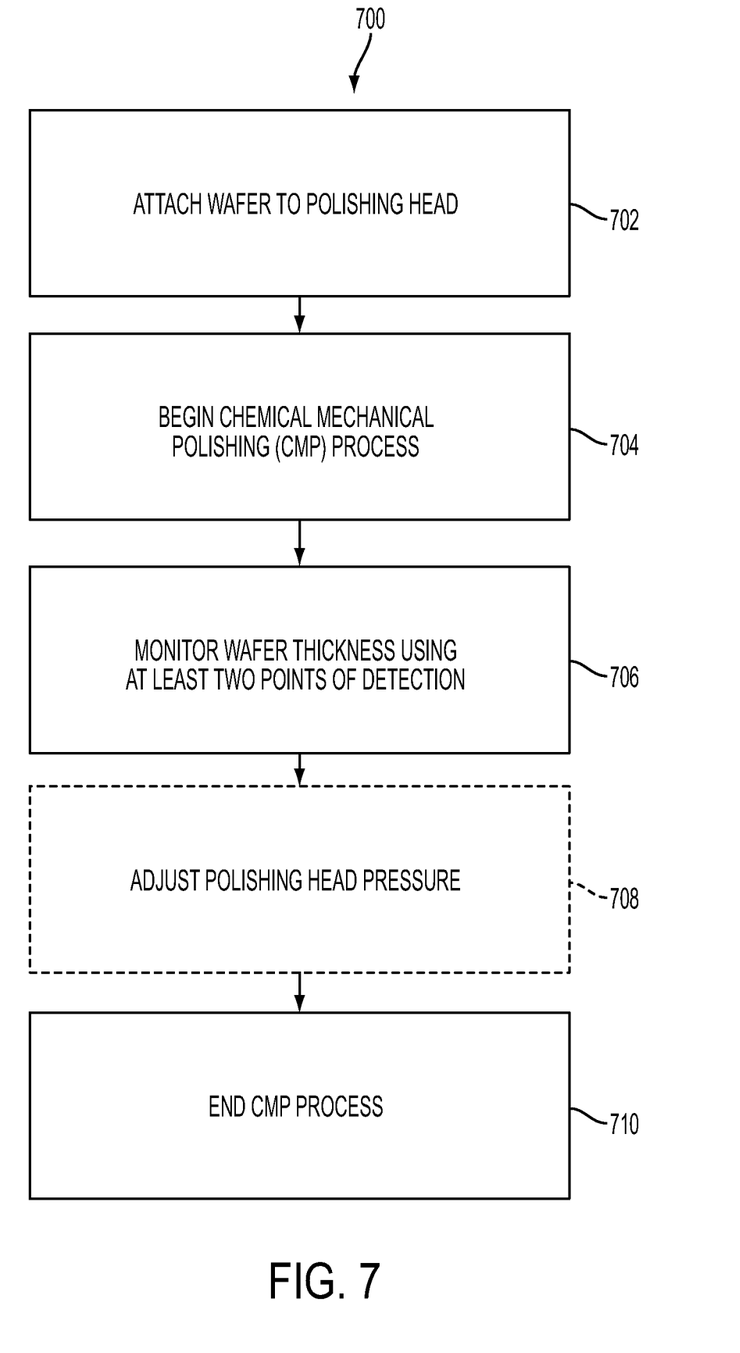
FIG. 7 is a flowchart of a method of using a CMP system in accordance with one or more embodiments.

FIG. 7 is a flowchart of a method 700 of using a CMP system in accordance with one or more embodiments. In step 702, a wafer is attached to a polishing head. In some embodiments, the wafer is attached to polishing head 506. In some embodiments, the wafer is attached to the polishing head using a retaining ring. In some embodiments, the wafer is attached to the polishing head using a vacuum or other suitable attachment element.

In step 704, a CMP process is begun. The CMP process comprises applying pressure on the wafer against a polishing pad. In some embodiments, the wafer is rotated relative to the polishing pad. In some embodiments, the polishing pad is rotated relative to the wafer. In some embodiments, both the wafer and the polishing pad are rotated. The CMP process also includes applying a slurry to the polishing pad and conditioning the polishing pad to restore a texture of the polishing pad. In some embodiments, the wafer is configured to translate relative to the polishing pad. In some embodiments, the polishing pad is configured to translate relative to the wafer.

In step 706, a thickness of the wafer is monitored using at least two points of detection. In some embodiments, the thickness of the wafer is monitored using first and second detection points 413a and 413b. In some embodiments, more than two points of detection are used to monitor a thickness of the wafer. In some embodiments, the thickness of the wafer is monitored using reflected light beams.

In step 708, a pressure of a polishing head is adjusted. In some embodiments, the pressure of polishing head 506 is adjusted based on the first sensor parameter 618, second sensor parameter 620 and polishing head pressure 622. In some embodiments, the pressure of the polishing head is adjusted to provide a uniform profile on a polished surface of the wafer. In some embodiments, the pressure of the polishing head is adjusted by moving the polishing head in the direction perpendicular to the polishing pad. In some embodiments, step 708 is omitted because the surface profile of the wafer is uniform.

In step 710, the CMP process is ended. In some embodiments, the CMP process is ended by moving polishing head 506 to terminate contact between the wafer and polishing pad 504. In some embodiments, the CMP process is ended based on the first sensor parameter 618, second sensor parameter 620 and target thickness 624.

One aspect of this description relates to a wafer polishing system. The wafer polishing system includes a platen configured to rotate in a first direction, and a polishing head configured to hold a wafer, the polishing head configured to rotate in a second direction. The wafer polishing system further includes an optical sensing system configured to detect a thickness of the wafer at a first location on the platen and a second location on the platen. A first distance from a center of the platen to the first location is different than a second distance from the center of the platen to the second location.

Another aspect of this description relates to a method of polishing a wafer. The method includes attaching a wafer to a polishing head and rotating the polishing head in a first direction. The method further includes rotating a platen in a second direction and monitoring a thickness of the wafer a first location on the platen and a second location on the platen. A first distance from a center of the platen to the first location is different than a second distance from the center of the platen to the second location.

Still another aspect of this description relates to a control system for controlling a wafer polishing system. The control system includes an optical sensing system configured to monitor a thickness of a wafer at a first location on a platen and a second location on the platen, wherein a first distance from a center of the platen to the first location is different than a second distance from the center of the platen to the second location. The control system further includes a processor configured to determine the thickness of the wafer based on information received from the optical sensing system and generate a pressure adjustment signal. The control system further includes a polishing head configured to move in a direction perpendicular to a surface of the platen in response to the pressure adjustment signal.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A wafer polishing system comprising:
a platen configured to rotate in a first direction;
a polishing head configured to hold a wafer, the polishing head configured to rotate in a second direction; and
an end point sensing system configured to detect a thickness of the wafer at a first location on the platen and at a second location on the platen,
wherein a first distance from a center of the platen to the first location is different than a second distance from the center of the platen to the second location, and the first distance ranges from 0.4R to 0.6R, where R is a radius of the platen.

2. The wafer polishing system of claim 1, wherein the second distance ranges from 0.8R to R, where R is a radius of the platen.

3. The wafer polishing system of claim 1, further comprising a control system configured to monitor the thickness of the wafer and provide instructions to the polishing head to move in a direction perpendicular to the surface of the platen.

4. The wafer polishing system of claim 3, wherein the control system is further configured to monitor a profile of a surface of the wafer.

5. The wafer polishing system of claim 1, further comprising:
a polishing pad disposed over a surface of the platen, the polishing pad configured to remove material from the wafer; and
a slurry delivery system configured to supply a slurry to the polishing pad.

6. The wafer polishing system of claim 1, further comprising:
a polishing pad disposed over a surface of the platen, the polishing pad configured to remove material from the wafer; and
a conditioner configured to restore a texture of the polishing pad.

7. The wafer polishing system of claim 1, where the end point sensing system is an optical sensing system or an eddy current sensing system.

8. The wafer polishing system of claim 1, further comprising an eddy current sensing system comprises a first eddy current sensor configured at the first location; and a second eddy current sensor at the second location.

9. The wafer polishing system of claim 1, further comprising an optical sensing system, wherein the optical sensing system comprises:
a light source configured to provide a light beam; and a beam splitting element configured to split the light beam to provide a first light beam at the first location and a second light beam at the second location.

10. A method of polishing a wafer, the method comprising:
attaching a wafer to a polishing head;
rotating the polishing head in a first direction;
rotating a platen in a second direction; and
monitoring a thickness of the wafer at a first location on the platen and at a second location on the platen,
wherein a first distance from a center of the platen to the first location is different than a second distance from the center of the platen to the second location, and the second distance ranging from 0.8R to R, where R is equal to a radius of the platen.

11. The method of claim 10, further comprising terminating the polishing of the wafer when the thickness measured at each of the first and second locations equals a target thickness.

12. The method of claim 10, further comprising moving the polishing head in a direction perpendicular to a surface of the platen to adjust a pressure exerted on the wafer.

13. The method of claim 10, further comprising monitoring a profile of a surface of the wafer at the first location and the second location.

14. The method of claim 10, wherein monitoring the thickness of the wafer at the first location comprises monitoring the thickness of the wafer at the first distance ranging from 0.4R to 0.6R, where R is equal to a radius of the platen.

15. A control system for controlling a wafer polishing system, the control system comprising:
an endpoint sensing system configured to monitor a thickness of a wafer at a first location on a platen and at a second location on the platen, wherein a first distance from a center of the platen to the first location is different than a second distance from the center of the platen to the second location, and the first distance ranges from 0.4R to 0.6R, where R is a radius of the platen;
a processor configured to determine the thickness of the wafer based on information received from the endpoint sensing system and generate a pressure adjustment signal; and
a polishing head configured to move in a direction perpendicular to a surface of the platen in response to the pressure adjustment signal.

16. The control system of claim 15, wherein the second distance ranges from 0.8R to R, where R is a radius of the platen.

17. The control system of claim 15, further comprising an optical sensing system, wherein the optical sensing system comprises at least one light source configured to provide a light beam at the first location and the second location.

* * * * *